(12) United States Patent
Mao et al.

(10) Patent No.: US 12,294,312 B2
(45) Date of Patent: May 6, 2025

(54) LOW STRAY INDUCTANCE BUSBAR STRUCTURE FOR POWER MODULE

(71) Applicant: ZHENGHAI GROUP CO., LTD., Shandong (CN)

(72) Inventors: Xianye Mao, Shandong (CN); Jingya Sun, Shandong (CN); Changcheng Wang, Shandong (CN)

(73) Assignee: ZHENGHAI GROUP CO., LTD., Shandong (CN)

( * ) Notice: Subject to any disclaimer, the term of this patent is extended or adjusted under 35 U.S.C. 154(b) by 117 days.

(21) Appl. No.: 18/020,067

(22) PCT Filed: Oct. 26, 2021

(86) PCT No.: PCT/CN2021/126304
§ 371 (c)(1),
(2) Date: Feb. 6, 2023

(87) PCT Pub. No.: WO2022/142640
PCT Pub. Date: Jul. 7, 2022

(65) Prior Publication Data
US 2023/0308027 A1    Sep. 28, 2023

(30) Foreign Application Priority Data
Dec. 28, 2020 (CN) .......... 202011580372.8

(51) Int. Cl.
*H02M 7/00* (2006.01)
*H02K 11/33* (2016.01)
*H05K 1/03* (2006.01)

(52) U.S. Cl.
CPC ............ *H02M 7/003* (2013.01); *H02K 11/33* (2016.01); *H05K 1/0306* (2013.01); *H05K 1/0313* (2013.01)

(58) Field of Classification Search
None
See application file for complete search history.

(56) References Cited

U.S. PATENT DOCUMENTS

| 5,646,828 A | 7/1997 | Degani et al. |
| 2002/0034087 A1 | 3/2002 | Suzuki et al. |
| (Continued) | | |

FOREIGN PATENT DOCUMENTS

| CN | 104617414 A | 5/2015 |
| CN | 111627899 A | 9/2020 |
| (Continued) | | |

OTHER PUBLICATIONS

International Search Report for PCT/CN2021/126304 mailed Jan. 20, 2022, ISA/CN.
(Continued)

*Primary Examiner* — Hoa C Nguyen
*Assistant Examiner* — John B Freal
(74) *Attorney, Agent, or Firm* — Yue (Robert) Xu; Apex Attorneys at Law, LLP

(57) ABSTRACT

A busbar structure with less stray inductance for a power module includes a radiator, a copper-clad ceramic substrate, a wafer, a plastic case, a positive busbar, a negative busbar and a potting compound. The copper-clad ceramic substrate is welded on the radiator. The wafer is welded on the copper-clad ceramic substrate. The plastic case is fixed on the radiator. The positive and negative busbars are packaged in the plastic case, and fixed on the copper-clad ceramic substrate by ultrasonic bonding. An electrical clearance between wafers as well as an electrical clearance between the positive and negative busbars are ensured by potting. A part of the positive busbar covers a part of the negative busbar. The part of the positive busbar and the part of the (Continued)

negative busbar extend from the inside of the plastic case to the outside of the plastic case.

8 Claims, 4 Drawing Sheets

(56) References Cited

U.S. PATENT DOCUMENTS

| | | | |
|---|---|---|---|
| 2006/0202324 A1 | 9/2006 | Hashimoto et al. | |
| 2006/0220216 A1 | 10/2006 | Mizuno | |
| 2015/0371937 A1* | 12/2015 | Yoshihara | H01L 24/37 |
| | | | 361/761 |
| 2021/0320055 A1* | 10/2021 | Oomori | H01L 23/057 |

FOREIGN PATENT DOCUMENTS

| | | |
|---|---|---|
| CN | 111816634 A | 10/2020 |
| CN | 112583210 A | 3/2021 |
| CN | 214337745 U | 10/2021 |
| JP | H08250652 A | 9/1996 |
| JP | 2002095268 A | 3/2002 |
| JP | 2005064398 A | 3/2005 |
| JP | 2006253183 A | 9/2006 |
| JP | 2006278913 A | 10/2006 |
| JP | 2010124691 A | 6/2010 |
| JP | 2010193713 A | 9/2010 |
| JP | 2019088137 A | 6/2019 |
| JP | 2020113639 A | 7/2020 |
| WO | 2020035931 A1 | 2/2020 |

OTHER PUBLICATIONS

The Japanese 1st Office Action issued on Jun. 30, 2023 for JP2022-535074.
The Japanese 2nd Office Action issued on Dec. 15, 2023 for JP2022-535074.
The Japanese 3rd Office Action issued on Jun. 26, 2024 for JP2022-535074.
The European search report issued on Aug. 14, 2024 for EP21913385.7.

* cited by examiner

LOW STRAY INDUCTANCE BUSBAR STRUCTURE FOR POWER MODULE

This application is the national phase of International Patent Application No. PCT/CN2021/126304, titled "LOW STRAY INDUCTANCE BUSBAR STRUCTURE FOR POWER MODULE", filed on Oct. 26, 2021, which claims priority to Chinese Patent Application No. 202011580372.8, titled "LOW STRAY INDUCTANCE BUSBAR STRUCTURE FOR POWER MODULE", filed on Dec. 28, 2020 with the China National Intellectual Property Administration, both of which are incorporated herein by reference in their entireties.

FIELD

The present disclosure relates to the technical field of motor control, and in particular to a busbar structure with less stray inductance for a power module.

BACKGROUND

In a three-phase alternating current motor drive system, a high-frequency carrier is usually used to switch on or off a power semiconductor device at a high speed, and a surge voltage proportional to stray inductance of a main circuit for driving a motor is applied on the power semiconductor device. Excessive surge voltage may result in breakdown of the power semiconductor device. It can be seen that the surge voltage can be reduced by minimizing the stray inductance of the main circuit, so as to ensure normal operation of the power semiconductor device. Especially in the field of motor controllers for new energy vehicles, SiC and GaN power modules are increasingly used in the new energy vehicles, and the power semiconductor device is switched on or off with an increasing frequency. Therefore, how to reduce the stray inductance of a busbar in the power module is an important research subject.

The surge voltage $V_1$ is generally calculated from the following Equation (1):

$$V_1 = L \times \frac{di}{dt} \qquad (1)$$

In Equation (1), $$L = \frac{\phi}{I} \text{ and } \phi = S \times B = a \times h \times B = a \times h \times \mu_0 \times \frac{I}{w},$$

and the following Equation (2) is therefore obtained:

$$L = \mu_0 \times \frac{a \times h}{w} \qquad (2)$$

In Equations (1) and (2), L represents stray inductance, $\phi$ represents magnetic flux, I represents a current, B represents magnetic induction intensity, a represents a length of a busbar in a connection terminal of the main circuit, w represents a width of the busbar in the connection terminal of the main circuit, h is a distance between busbars that overlap each other, and $\mu_0$ represents vacuum permeability.

As shown in FIGS. 1 and 2, a main circuit structure in a three-phase alternating current motor drive system includes a radiator 4, a copper-clad ceramic substrate 5, a wafer 6, a plastic case 3, a positive busbar 1, a negative busbar 2 and a potting compound 7. The copper-clad ceramic substrate 5 is welded on the radiator 4. Multiple wafers 6 are welded on the copper-clad ceramic substrate 5. The plastic case 3 is fixed on the radiator 4. The positive busbar 1 and the negative busbar 2 are fixed on the copper-clad ceramic substrate 5 by ultrasonic bonding and form an electrical circuit of a power module 6. An electrical clearance between wafers as well as an electrical clearance between positive and negative busbars are ensured with the potting compound 7. The wafer may be a power transistor chip made of Si, SiC, GaN or the like. In the main circuit structure, the positive and negative busbars are injection-molded in the plastic case 3 with one of the positive and negative busbars being arranged above the other of the positive and negative busbars. As shown in FIG. 2, the positive busbar 1 overlaps the negative busbar 2 in an L2 area, the positive and negative busbars are packaged in an insulated manner in the plastic case 3 in an L1 area, and the positive and negative busbars do not overlap with each other in an L3 area. The positive busbar 1 and the negative busbar 2 are packaged in the plastic case 3, do not cover each other, and further extend out of the plastic case 3 to be connected to a copper layer with different polarity from the copper-clad ceramic substrate 5. Therefore, the L3 area is generally a non-overlapping area. A current loop in the L3 area may be regarded as a current loop formed with the ground. The loop through which a current flows has a large area S, that is, a value of a×h in Equation (2) is large. It can be seen from Equation (2) that the stray inductance L increases. The stray inductance significantly affects switching characteristics of the power module, reducing the reliability of motor control.

SUMMARY

The technical problem to be solved by the present disclosure is to provide a busbar structure with less stray inductance for a power module, so as overcome the defects of the traditional main circuit structure for driving a three-phase alternating current motor, thereby effectively reducing the surge voltage caused by the stray inductance, avoiding the risk of breakdown of the power module, improving anti-vibration performance of the power module, and further ensuring the switching characteristics of the power module and the reliability of motor control.

In order to solve the above technical problems, the busbar structure with less stray inductance for a power module according to the present disclosure includes a radiator, a copper-clad ceramic substrate, a wafer, a plastic case, a positive busbar, a negative busbar and a potting compound. The copper-clad ceramic substrate is welded on the radiator. The wafer is welded on the copper-clad ceramic substrate. The plastic case is fixed on the radiator. The positive busbar and the negative busbar are packaged in the plastic case with the potting compound. The positive busbar and the negative busbar are fixed on the copper-clad ceramic substrate by ultrasonic bonding and form an electrical circuit of the power module. An electrical clearance between wafers as well as an electrical clearance between the positive and negative busbars are ensured by potting with the potting compound. A part of the positive busbar covers a part of the negative busbar. The part of the positive busbar and the part of the negative busbar extend from the inside of the plastic case to the outside of the plastic case.

Further, the part of the positive busbar and the part of the negative busbar extend out of the plastic case larger than or equal to 0 in length.

Further, the positive busbar and the negative busbar are arranged in parallel and overlap each other, and extend to the copper-clad ceramic substrate. The positive busbar is arranged above the negative busbar. Alternatively, the negative busbar is arranged above the positive busbar. A distance between the positive busbar and the negative busbar is less than or equal to 3 mm.

Further, a difference between a width and a length of the part of the positive busbar that covers the part of the negative busbar is larger than or equal to 0.

Further, a potting surface of the potting compound is higher than at least a lower one of the positive busbar and the negative busbar that overlap each other.

Further, the potting compound is silica gel or epoxy resin.

The busbar structure with less stray inductance for the power module according to the present disclosure adopts the above technical solutions. That is, the structure includes a radiator, a copper-clad ceramic substrate, a wafer, a plastic case, a positive busbar, a negative busbar and a potting compound. The copper-clad ceramic substrate is welded on the radiator. The wafer is welded on the copper-clad ceramic substrate. The plastic case is fixed on the radiator. The positive busbar and the negative busbar are packaged in the plastic case with the potting compound. The positive busbar and the negative busbar are fixed on the copper-clad ceramic substrate by ultrasonic bonding and form an electrical circuit of the power module. An electrical clearance between wafers as well as an electrical clearance between the positive and negative busbars are ensured by potting with the potting compound. A part of the positive busbar covers a part of the negative busbar. The part of the positive busbar and the part of the negative busbar extend from the inside of the plastic case to the outside of the plastic case. The use of the structure overcomes the defects of the traditional main circuit structure for driving the three-phase alternating current motor, thereby effectively reducing the surge voltage caused by the stray inductance, avoiding a risk of breakdown of the power module, improving anti-vibration performance of the power module, and further ensuring switching characteristics of the power module and reliability of motor control.

BRIEF DESCRIPTION OF THE DRAWINGS

The present disclosure is further described in detail in conjunction with the accompanying drawings and embodiments below. In the drawings.

DETAILED DESCRIPTION

Figure 1:
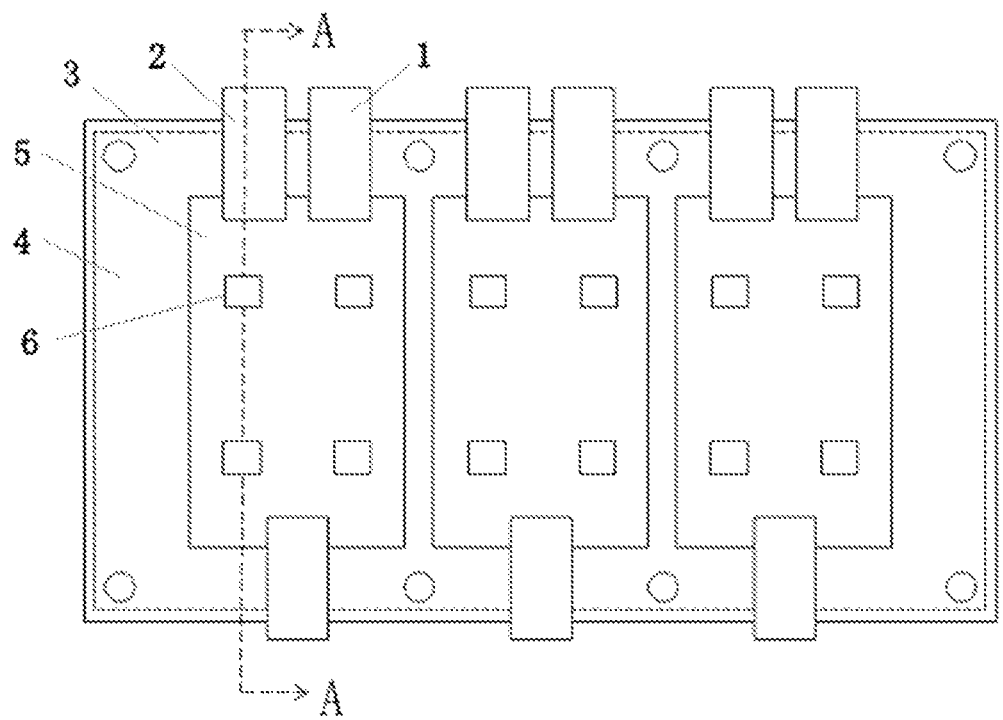
FIG. 1 is a schematic structural diagram illustrating a main circuit for driving a three-phase alternating current motor.
Figure 2:
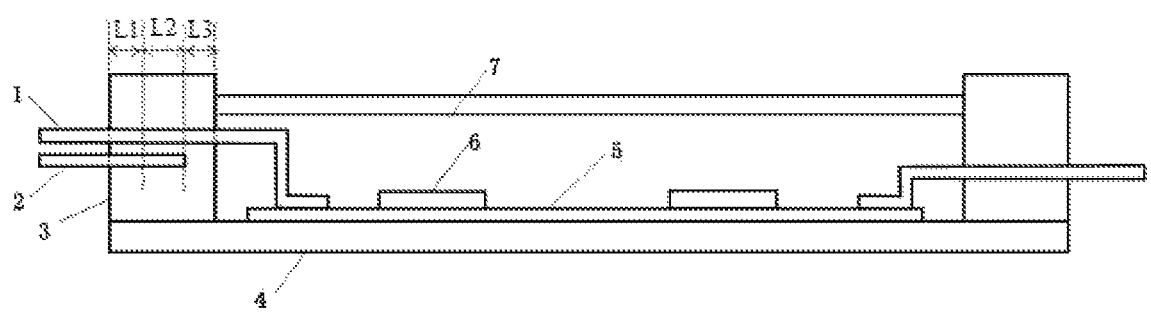
FIG. 2 illustrates the main circuit in the A-A direction as shown in FIG. 1.
Figure 3:
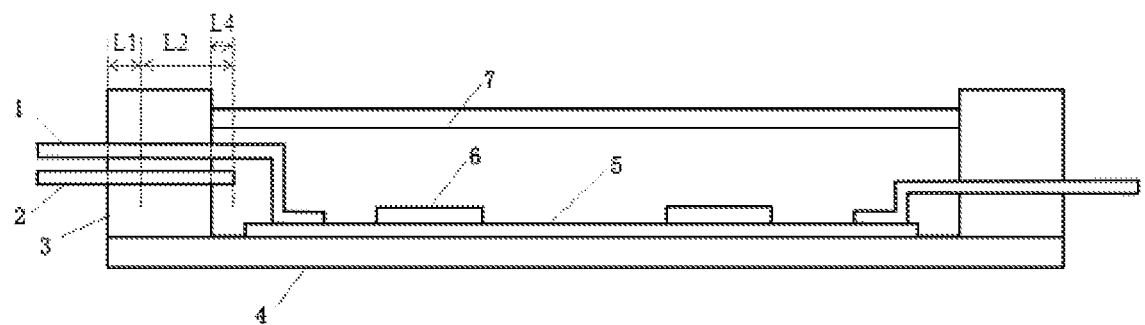
FIG. 3 is a schematic diagram illustrating a busbar structure with less stray inductance for a power module according to the present disclosure.
Figure 4:
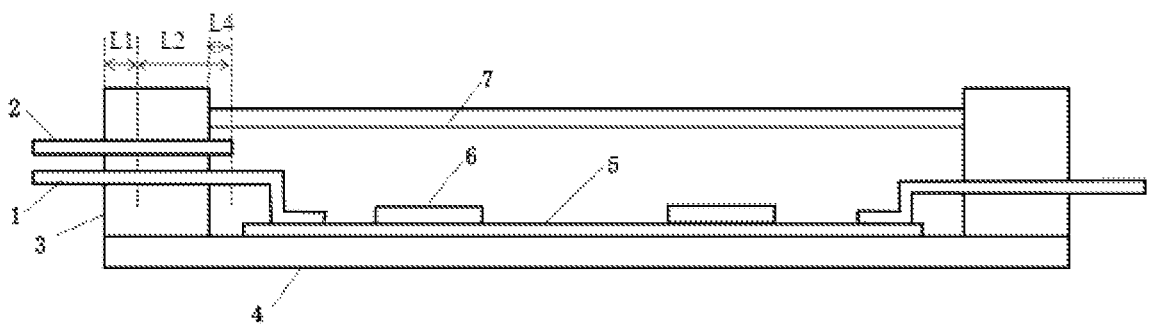
FIG. 4 is a schematic diagram illustrating the busbar structure in which a negative busbar is arranged above a positive busbar and the negative busbar overlaps the positive busbar.
Figure 5:
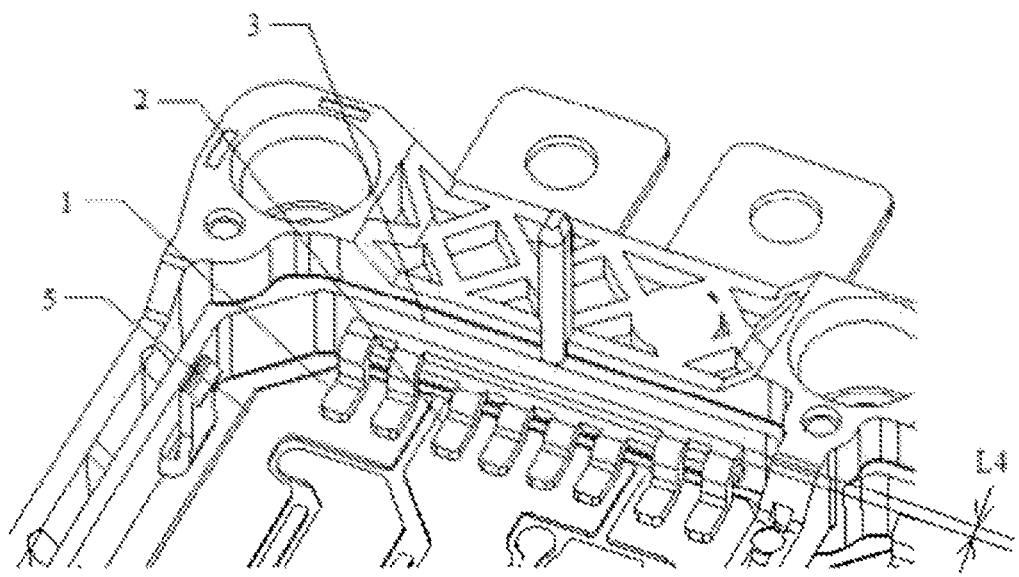
FIG. 5 is a schematic axonometric view partially illustrating the busbar structure.
Figure 6:
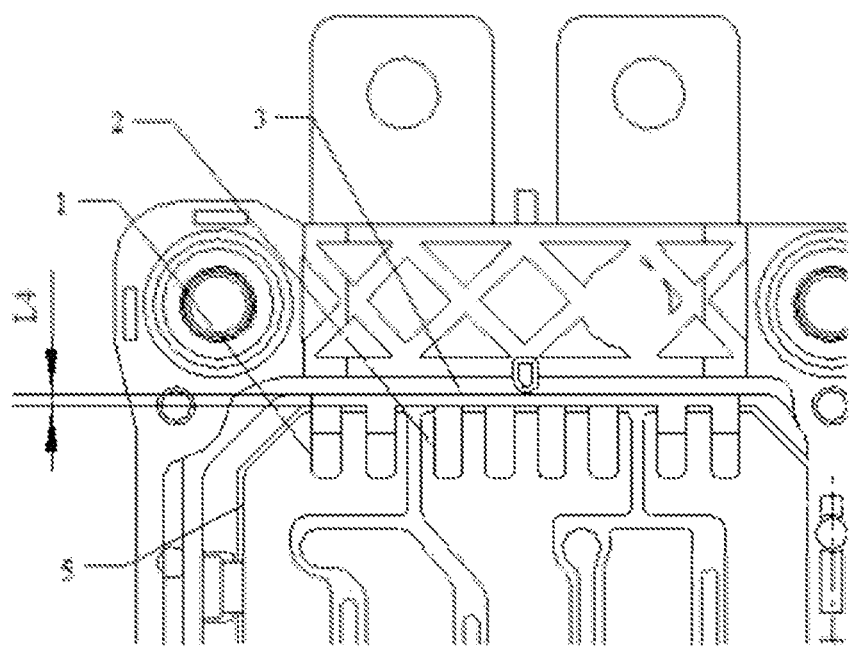
FIG. 6 is a schematic plane view partially illustrating the busbar structure.
Figure 7:
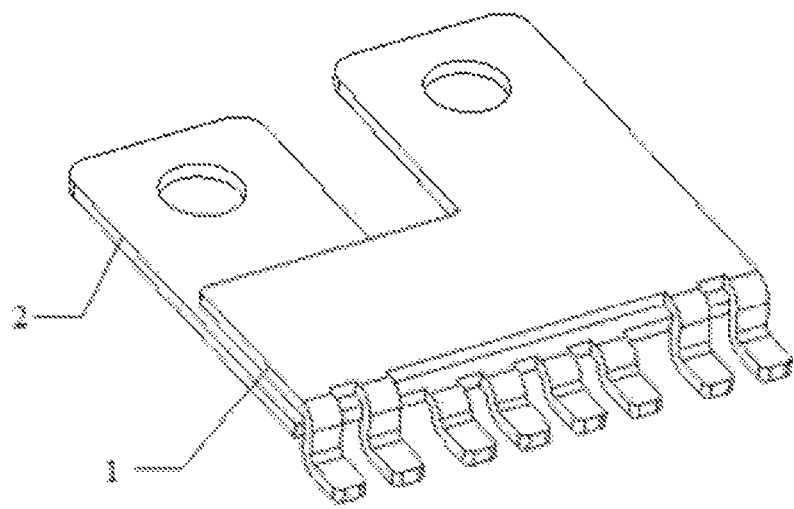
FIG. 7 is a schematic diagram illustrating the busbar structure in which the positive busbar is arranged above the negative busbar and the positive busbar overlaps the negative busbar.
Figure 8:
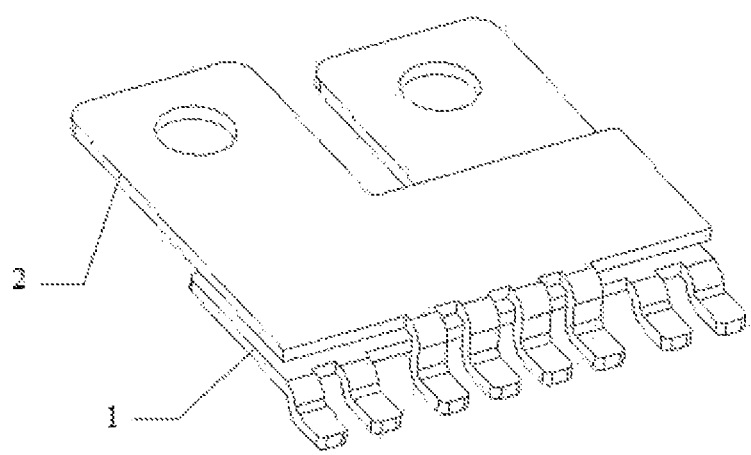
FIG. 8 is a schematic diagram illustrating the busbar structure in which the negative busbar is arranged above the positive busbar and the negative busbar overlaps the positive busbar.

As shown in FIG. 3, a busbar structure with less stray inductance for a power module according to the present disclosure includes a radiator 4, a copper-clad ceramic substrate 5, a wafer 6, a plastic case 3, a positive busbar 1, a negative busbar 2 and a potting compound 7. The copper-clad ceramic substrate 5 is welded on the radiator 4. The wafer 6 is welded on the copper-clad ceramic substrate 5. The plastic case 3 is fixed on the radiator 4. The positive busbar 1 and the negative busbar 2 are packaged in the plastic case 3 with the potting compound 7. The positive busbar 1 and the negative busbar 2 are fixed on the copper-clad ceramic substrate 5 by ultrasonic bonding and form an electrical circuit of the power module. An electrical clearance between wafers 6 as well as an electrical clearance the positive and negative busbars 1 and 2 are ensured by potting with the potting compound 7. A part of the positive busbar 1 covers a part of the negative busbar 2. The part of the positive busbar 1 and the part of the negative busbar 2 extend from the inside of the plastic case 3 to the outside of the plastic case 3.

Preferably, as shown in FIGS. 3, 4, 5 and 6, the part of the positive busbar 1 and the part of the negative busbar 2 extend out of the plastic case 3 larger than or equal to 0 in length. That is, L4 in the drawings is greater than or equal to 0.

Preferably, as shown in FIGS. 3, 4, 7 and 8, the positive busbar 1 and the negative busbar 2 are arranged in parallel and overlap each other, and extend to the copper-clad ceramic substrate 5. The positive busbar 1 is arranged above the negative busbar 2. Alternatively, the negative busbar 2 is arranged above the positive busbar 1. A distance between the positive busbar 1 and the negative busbar 2 is less than or equal to 3 mm.

Preferably, a difference between a width and a length of the part of the positive busbar 1 that covers the part of the negative busbar 2 is larger than or equal to 0. Preferably, the width is equal to the length.

Preferably, a potting surface of the potting compound 7 is higher than at least a lower one of the positive busbar 1 and the negative busbar 2 that overlap each other.

Preferably, the potting compound 7 is silica gel or epoxy resin.

This structure effectively solves the problem of excessive stray inductance of a busbar terminal inside the power module. The positive busbar overlaps the negative busbar in the L2 area. The positive busbar and the negative busbar extend out of the plastic case to the inside of the power module. In addition, the electrical clearance between the positive and negative busbars as well as an electrical clearance between power modules are ensured by insulation potting with the potting compound, significantly reducing a part of the positive busbar not covering the negative busbar and a part of the negative busbar not covering the positive busbar. Therefore, the area S of the loop through which the current flows decreases, that is, the value of a×h in Equation (2) decreases. According to Equation (2), the stray inductance L decreases accordingly, thereby effectively reducing the surge voltage, avoiding the risk of breakdown of the power module, ensuring the switching characteristics of the power module, and improving the reliability of motor control.

The invention claimed is:

1. A busbar structure with less stray inductance for a power module, comprising:
   a radiator;
   a copper-clad ceramic substrate;
   a wafer;
   a plastic case;
   a positive busbar;
   a negative busbar; and
   potting compound;
   wherein the copper-clad ceramic substrate is welded on the radiator,
   the wafer is welded on the copper-clad ceramic substrate,
   the plastic case is fixed on the radiator,
   the positive busbar and the negative busbar are packaged in the plastic case with the potting compound, and are fixed on the copper-clad ceramic substrate by ultrasonic bonding, to form an electrical circuit of the power module,
   an electrical clearance between wafers as well as an electrical clearance between the positive busbar and the negative busbar are ensured by potting with the potting compound,
   wherein a part of the positive busbar covers a part of the negative busbar, and the part of the positive busbar and the part of the negative busbar extend inside the plastic case and beyond a surface of the plastic case, and
   wherein a width of the part of the positive busbar that covers the part of the negative busbar is larger than or equal to a length of the part of the positive busbar that covers the part of the negative busbar.

2. The busbar structure with less stray inductance for a power module according to claim 1, wherein the part of the positive busbar and the part of the negative busbar that covers each other, extending inside the plastic case, is larger than or equal to 0 in length.

3. The busbar structure with less stray inductance for a power module according to claim 2, the positive busbar is parallel with and overlap the negative busbar, the positive busbar and the negative busbar extend to the copper-clad ceramic substrate, the positive busbar is arranged above the negative busbar or the negative busbar is arranged above the positive busbar, and a distance between the positive busbar and the negative busbar is less than or equal to 3 mm.

4. The busbar structure with less stray inductance for a power module according to claim 3, wherein a potting surface of the potting compound is higher than at least a lower one of the positive busbar and the negative busbar that overlap each other.

5. The busbar structure with less stray inductance for a power module according to claim 3, wherein the potting compound is silica gel or epoxy resin.

6. The busbar structure with less stray inductance for a power module according to claim 1, the positive busbar is parallel with and overlap the negative busbar, the positive busbar and the negative busbar extend to the copper-clad ceramic substrate, the positive busbar is arranged above the negative busbar or the negative busbar is arranged above the positive busbar, and a distance between the positive busbar and the negative busbar is less than or equal to 3 mm.

7. The busbar structure with less stray inductance for a power module according to claim 6, wherein a potting surface of the potting compound is higher than at least a lower one of the positive busbar and the negative busbar that overlap each other.

8. The busbar structure with less stray inductance for a power module according to claim 6, wherein the potting compound is silica gel or epoxy resin.

* * * * *